(12) United States Patent  
Elpelt et al.

(10) Patent No.: US 8,772,140 B2  
(45) Date of Patent: Jul. 8, 2014

(54) PRODUCTION METHOD FOR A UNIPOLAR SEMICONDUCTOR COMPONENT AND SEMICONDUCTOR DEVICE

(75) Inventors: Rudolf Elpelt, Erlangen (DE); Peter Friedrichs, Nürnberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/383,593

(22) PCT Filed: Jul. 12, 2010

(86) PCT No.: PCT/EP2010/059976  
§ 371 (c)(1), (2), (4) Date: Jan. 27, 2012

(87) PCT Pub. No.: WO2011/006866  
PCT Pub. Date: Jan. 20, 2011

(65) Prior Publication Data  
US 2012/0187419 A1    Jul. 26, 2012

(30) Foreign Application Priority Data  
Jul. 15, 2009  (DE) .......... 10 2009 033 302

(51) Int. Cl.  
*H01L 21/00*    (2006.01)  
*H01L 29/15*    (2006.01)

(52) U.S. Cl.  
USPC ........................................... 438/505; 257/77

(58) Field of Classification Search  
USPC ............. 257/77, E21.102, E29.084, E29.089, 257/76; 438/505  
See application file for complete search history.

(56) References Cited

U.S. PATENT DOCUMENTS

| | | | |
|---|---|---|---|
| 6,320,207 B1 | 11/2001 | Furukawa et al. | |
| 7,470,960 B1 * | 12/2008 | Sugawara | 257/401 |
| 7,851,274 B1 * | 12/2010 | Shah | 438/139 |
| 2008/0142811 A1 * | 6/2008 | Matocha et al. | 257/77 |

FOREIGN PATENT DOCUMENTS

| | | |
|---|---|---|
| DE | 2103389 | 8/1971 |
| GB | 1351867 | 5/1974 |

OTHER PUBLICATIONS

Hu, C. "Optimum Doping Profile for Minimum Ohmic Resistance and High-Breakdown Voltage." IEEE Transactions on Electron Devices, vol. ED-26, No. 2, Mar. 1979.

* cited by examiner

*Primary Examiner* — Fernando L Toledo  
*Assistant Examiner* — Neil Prasad  
(74) *Attorney, Agent, or Firm* — Murphy, Bilak & Homiller, PLLC

(57) ABSTRACT

A unipolar semiconductor component having a drift layer is produced by forming the drift layer with a continuously decreasing concentration of a charge carrier doping along the growth direction of the drift layer by way of epitaxial precipitation of the material of the drift layer, which comprises at least one wide band gap material. By using silicon carbide for the drift layer formed by the epitaxial precipitation, a subsequent change of the continuously decreasing concentration of the charge carrier doping due to a diffusion of the dopant atoms in downstream processes is suppressed. The production method can be used in particular to implement a unipolar semiconductor component comprising a drift layer, which component has an advantageous ratio of a comparatively high reverse bias voltage with relatively low forward losses, in a simple and/or cost-effective manner. The unipolar semiconductor component can be an active or passive semiconductor component.

18 Claims, 7 Drawing Sheets

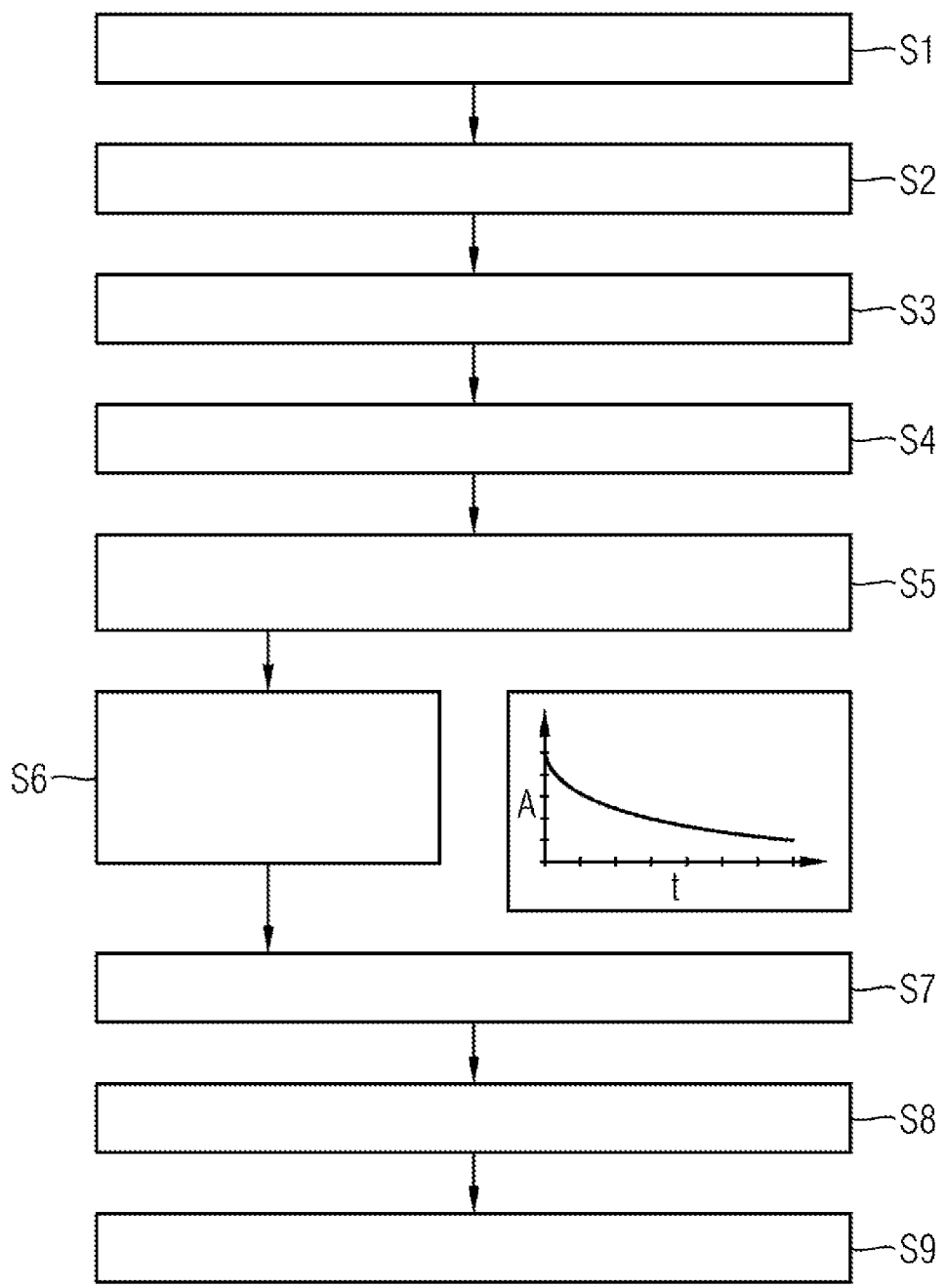

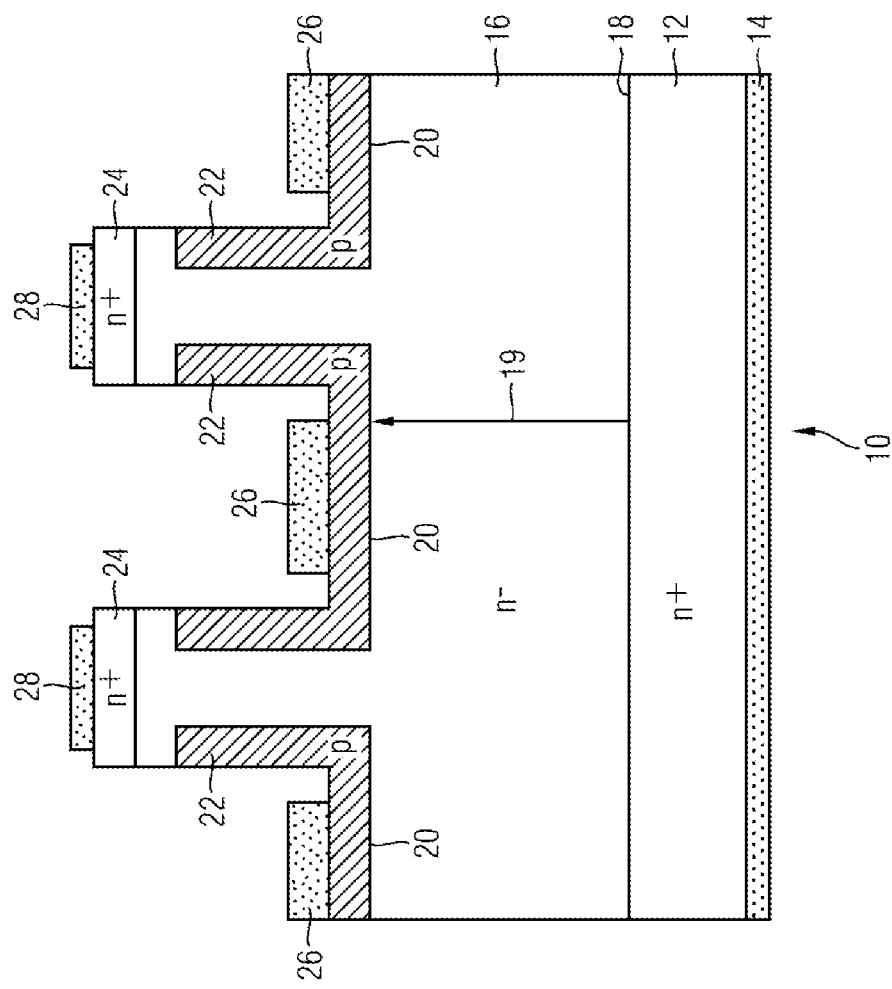

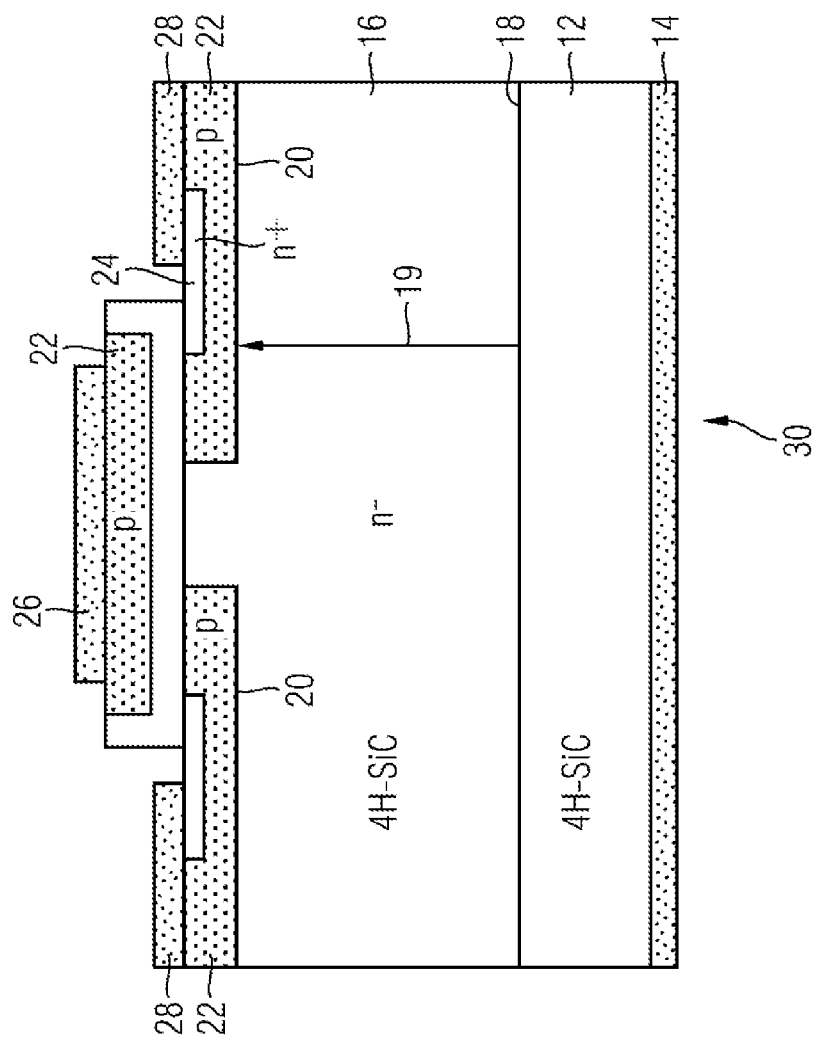

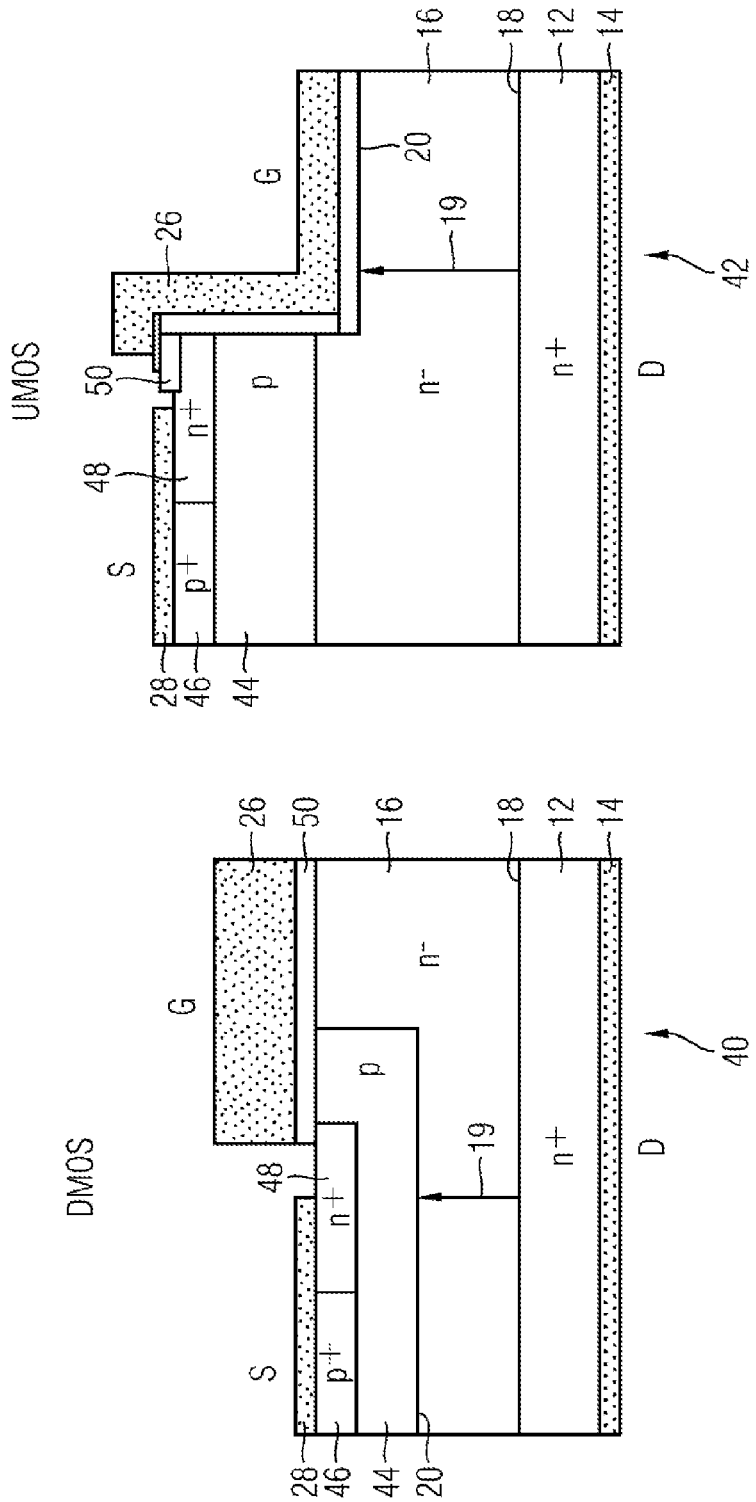

PRODUCTION METHOD FOR A UNIPOLAR SEMICONDUCTOR COMPONENT AND SEMICONDUCTOR DEVICE

The invention relates to a method for producing a unipolar semiconductor component comprising a drift layer. The invention furthermore relates to a semiconductor device.

A semiconductor component often has a so-called drift layer. The drift layer is configured to absorb a breakdown voltage in an off state of the semiconductor component. During conductive operation of the semiconductor component, a current can flow through the drift layer, in which case an electrical power loss which is as low as possible is advantageous.

In general, a drift layer of a semiconductor component has uniform and constant doping along its growth direction. As an alternative to this, the publication "Optimum Doping Profile for Minimum Ohmic Resistance and High-Breakdown Voltage" (IEEE TRANSACTIONS ON ELECTRON DEVICES, VOL. ED-26, NO. 3, MARCH 1979) describes a Schottky diode having a drift layer consisting of silicon, which comprises charge-carrier doping that, starting from a minimum on an upper interface of the drift layer lying away from the substrate, tends to infinity with an increasing distance from the upper interface. The authors of this publication therefore describe the charge-carrier doping as scarcely achievable in reality.

DE 2 103 389 describes a method for producing a silicon drift layer of a semiconductor component, which has an approximately linear rise in doping with increasing depth. It is proposed here to form the drift layer by means of epitaxial deposition. A silicon drift layer produced in this way, however, has an unfavorable behavior in respect of a comparatively low breakdown voltage with relatively high conduction losses.

It is the object of the present invention to provide an improved semiconductor component comprising a drift layer.

This object is achieved by a method for producing a unipolar semiconductor component having the features of patent claim 1 and by a semiconductor device having the features of patent claim 11.

The invention provides a method for producing a unipolar semiconductor component having a drift layer, comprising the step of: forming the drift layer with a continuously decreasing concentration of charge-carrier doping along the growth direction of the drift layer by epitaxial deposition of a material of the drift layer, which comprises at least one wide-bandgap material.

A semiconductor device is likewise provided, which has a substrate region and a unipolar semiconductor component with a drift layer, wherein the drift layer has a continuously decreasing concentration of charge-carrier doping along a direction from a first interface which faces the substrate region to a second interface on the opposite side from the first interface, and which comprises at least one wide-bandgap material.

The continuously decreasing concentration of the charge-carrier doping along the growth direction of the drift layer may, for example, be a strictly monotonically decreasing concentration of the charge-carrier doping. The drift layer is not in this case restricted to a particular doping type. The continuously decreasing concentration may be p-type doping or n-type doping.

A preferred (optimal) doping profile can be achieved straightforwardly and reliably in a drift layer comprising a wide-bandgap material (for example silicon carbide) by means of epitaxial deposition of the drift-layer material. Because the epitaxy of a wide-bandgap material is generally carried out at high temperatures and the atoms of the crystal lattice are bonded more strongly than in the case of silicon, for example, later modification of the concentration profile due to diffusion of the doping atoms is prevented since subsequent processes are usually carried out at lower temperatures.

This is a substantial advantage of a drift layer comprising a wide-bandgap material over a drift layer consisting of silicon. After formation of a drift layer consisting of silicon, undesired diffusion of the doping atoms due to subsequent processes generally takes place, which modifies the preferred doping profile. In the present invention, this diffusion of the doping atoms is prevented. Here, the wide-bandgap material is intended to mean a material having a large energy gap.

By means of the present invention, a drift layer having an advantageous continuously decreasing concentration of charge-carrier doping along the growth direction of the drift layer, a so-called gradient epitaxial layer, can be achieved in a straightforward way, and can be used over a comparatively long period of time, by employing the advantageous concentration of the charge-carrier doping. By taking into account a predetermined/preferred maximum electric field on the depletion layer of the drift layer and a predetermined/preferred breakdown voltage, the advantageous doping profile of the gradient epitaxial layer can be established and maintained over the comparatively long period of time. The invention therefore permits a semiconductor component comprising a drift layer, for which an advantageous combination of a comparatively high breakdown voltage with relatively low conduction losses is ensured.

The semiconductor component may be an active semiconductor component, for example a MOSFET or a JFET. The semiconductor component may likewise be a passive semiconductor component, for example a Schottky diode. In particular, the semiconductor component may be formed as a high-breakdown, vertically constructed unipolar power component.

In another preferred embodiment of the production method, the drift layer is formed from the wide-bandgap material and the charge-carrier doping. Undesired diffusion of the doping atoms is reliably prevented in this case.

Advantageously, the drift layer (16) is formed at least from a wide-bandgap material having an energy gap which is greater than the energy gap of silicon. The energy gap of the wide-bandgap material is preferably at least 2 eV wide. This will reliably ensure the advantages described above.

Preferably, the drift layer is formed at least from silicon carbide and/or gallium nitride. Because the epitaxy of silicon carbide is carried out at high temperatures of more than 1400° C. and the atoms of the crystal lattice are bonded more strongly than in the case of silicon, for example, later modification of the concentration profile due to diffusion of the doping atoms is prevented. This advantage is also ensured if the annealing is carried out at a somewhat higher temperature than the epitaxy.

This advantage is also ensured when using gallium nitride. The epitaxy of gallium nitride is usually carried out at from 1000° C. to 1200° C. Although the annealing of further doping implantations may sometimes be carried out at higher temperatures, significant diffusion nevertheless does not take place. It is furthermore to be pointed out that diffusion through silicon carbide and/or gallium nitride and/or another wide-bandgap material is prevented not only because of the temperature during the epitaxy, but also by the crystal structure of a wide-bandgap material. The crystal atoms are bonded more strongly in wide-bandgap materials, and this makes diffusion of atoms more difficult. Furthermore, the processes following the annealing are almost exclusively carried out at temperatures lower than the epitaxy temperature.

Preferably, the drift layer is formed with a layer thickness $d_{Epi}$ which is established while taking into account a preferred breakdown voltage $V_{Br}$ of the drift layer and a preferred maximum electric field $E_{max}$ of the drift layer. In particular, the following may apply in this case:

$$d_{Epi} = \frac{3V_{Br}}{3E_{max}}.$$

Alternatively, the following may also apply:

$$d_{Epi} = \frac{2V_{Br}}{E_{max}} \cdot \frac{f(\lambda)}{h(\lambda)},$$

where $$f(\lambda) = 2\frac{\sqrt{1+\lambda}-1}{\lambda},$$

$$h(\lambda) = 4 \cdot \left\{\frac{2}{3\lambda^2}[(1+\lambda)^{3/2}-1] - \frac{1}{\lambda}\right\},$$

and $\lambda$ lies in a range of between 10 and 1000.

The drift layer with the continuously decreasing concentration of the charge-carrier doping along the growth direction can therefore have the comparatively small layer thickness $d_{Epi}$. Here, the layer thickness $d_{Epi}$ is less than or equal to a reference layer thickness of a reference drift layer which may be used, with constant reference doping. This allows economical production of the drift layer with the continuously decreasing concentration of the charge-carrier doping while complying with advantageous values for the breakdown voltage and the conduction losses. The effect of this is that the drift layer (gradient epitaxial layer) with the layer thickness $d_{Epi}$ is less sensitive to variations in the doping parameters, for example the thickness.

As an alternative or in addition to this, an interface of the drift layer may be formed with maximum doping $N_0$ which is established while taking into account the preferred breakdown voltage $V_{Br}$ of the drift layer, the preferred maximum electric field $E_{max}$ of the drift layer and a gradient parameter $\lambda$. The gradient parameter determines the difference between the maximum doping concentration and a minimum doping concentration at a further interface of the drift layer, on the opposite side from the interface. Preferably, the maximum doping $N_0$ is established so that:

$$N_0 = \frac{\varepsilon_r \varepsilon_0 E_{max}}{2e_0 V_{Br}} \cdot \frac{2\sqrt{\lambda}}{3}.$$

Such maximum doping ensures an advantageous relationship between the breakdown voltage and the maximum field.

The advantage described in the paragraph above is also ensured if:

$$N_0 = \frac{\varepsilon_r \varepsilon_0 E_{max}^2}{2e_0 V_{Br}} \cdot \frac{h(\lambda)}{f^2(\lambda)},$$

where

-continued $$f(\lambda) = 2\frac{\sqrt{1+\lambda}-1}{\lambda},$$

$$h(\lambda) = 4 \cdot \left\{\frac{2}{3\lambda^2}[(1+\lambda)^{3/2}-1] - \frac{1}{\lambda}\right\},$$

and $\lambda$ lies in a range of between 10 and 1000.

As an alternative or in addition, the drift layer may be formed with a concentration $N(z)$ of the charge-carrier doping along the growth direction z of the drift layer which is established while taking into account the layer thickness $d_{Epi}$ of the drift layer, the maximum doping $N_0$ of the interface of the drift layer and the gradient parameter $\lambda$. Advantageously:

$$N(z) = \frac{N_0}{\sqrt{1+\lambda\left(1-\frac{z}{d_{Epi}}\right)}}.$$

The present invention therefore offers an optimal doping profile of the drift layer (gradient epitaxial layer), which can be achieved straightforwardly and reliably by means of the epitaxial deposition process by using a wide-bandgap material (for example silicon carbide and/or gallium nitride). Owing to the optimal doping profile of the drift layer, the conduction losses of the semiconductor component can be reduced by up to 25% with the same breakdown voltage. This is a significant advantage over a constantly doped drift layer.

For a given breakdown voltage class of a unipolar power component, for example a switch or a diode, the on-resistance can be reduced by up to 25% by using a gradient epitaxial layer. This can be achieved without entailing reductions in the blocking performance of the drift layer.

In a preferred embodiment, the gradient parameter lies in a range of between 10 and 1000. In particular, the gradient parameter may lie in a range of between 50 and 200. As will be mentioned in more detail below, a drift layer having such a value for the gradient parameter can be produced straightforwardly, and to a high percentage it offers the advantages of an infinite gradient parameter.

For example, the continuously decreasing concentration of the charge-carrier doping along the growth direction of the drift layer is formed by varying a gas flow of the at least one dopant for the charge-carrier doping during the epitaxial deposition of the material of the drift layer. In this way, the incorporation of doping atoms can be varied in a controlled way during the epitaxy process.

The continuously decreasing concentration of the charge-carrier doping along the growth direction of the drift layer may furthermore be formed by varying a ratio of a first gas flow and a second gas flow during the epitaxial deposition of the material of the drift layer (16), the first gas flow and the second gas flow comprising the wide-bandgap material. For example, the continuously decreasing concentration of the charge-carrier doping is formed by varying a ratio of carbon and silicon during the epitaxial deposition. Such a production method can also be carried out in a straightforward way.

The advantages of the production method, as described in the paragraphs above, are also ensured in a corresponding semiconductor device.

The invention will be explained in more detail below with the aid of the exemplary embodiments indicated in the schematic figures of the drawings, in which:

FIG. 2 shows a flowchart to represent a second embodiment of the method for producing a unipolar semiconductor component;

FIG. 3 shows a schematic representation of a first embodiment of the semiconductor device;

FIG. 4 shows a schematic representation of a second embodiment of the semiconductor device;

FIGS. 5A and 5B show schematic representations of a third embodiment of the semiconductor device.

In the figures—unless the contrary has been described—components which relate to identical or similar components are provided with the same reference numerals.

Figure 1A:
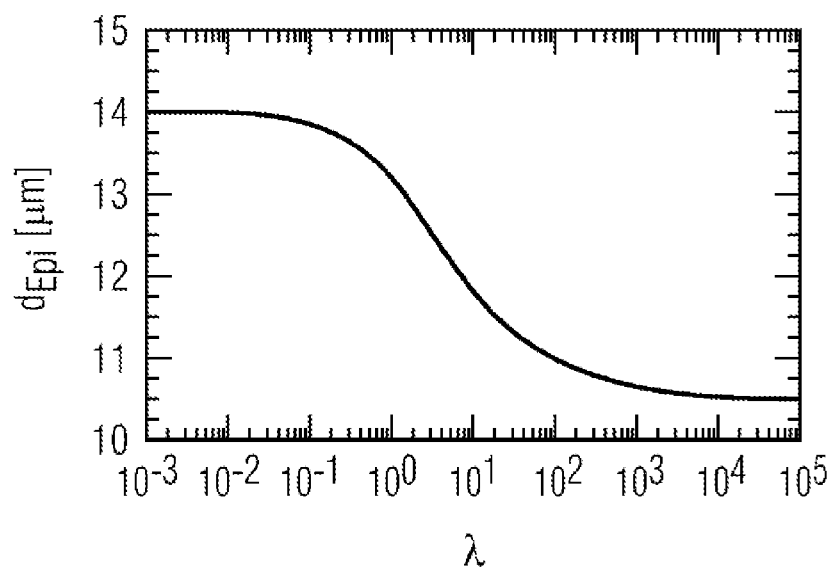
FIGS. 1A to 1D show four coordinate systems to explain a first embodiment of the method for producing a unipolar semiconductor component.

In order to describe the production method, a calculation rule is specified for an advantageous doping profile of a drift layer of the semiconductor component produced, while taking into account/complying with a predetermined/preferred maximum (electric) field $E_{max}$ of the drift layer and a predetermined/preferred breakdown voltage $V_{Br}$. Here, the advantageous doping profile is intended to mean a doping profile whose effect is that the drift layer has a relatively low layer resistance $\rho$ together with a breakdown voltage $V_{Br}$ which is as high as possible.

The production method explained below comprises epitaxial deposition of a material of the drift layer, which comprises at least one wide-bandgap material and charge-carrier doping. A suitable wide-bandgap material is, for example, silicon carbide and/or gallium nitride. The growth direction of the drift layer extends along the z axis, with a lower interface of the drift layer, which preferably lies next to a substrate, being oriented parallel to the xy plane with $z=d_{Epi}$ for a layer thickness $d_{Epi}$ of the drift layer produced. The upper interface, on the opposite side from the lower interface, is likewise oriented parallel to the xy plane with $z=0$. The terms lower interface and upper interface in this case refer to methods for producing a drift layer, in which the lower interface is formed before the upper interface. The production method described here may, however, also be adapted to the production of a drift layer with a growth direction from the top downward.

Independently of the doping profile $N(z)$ along the growth direction, equations (Eq 1) to (Eq 3) apply for the electric field $E(z)$, the potential $V(z)$ and the layer resistance $\rho$, where $e_0$ denotes the elemental charge, $\epsilon_0$ denotes the vacuum permittivity, $\epsilon_r$ denotes the relative permittivity and $\mu$ denotes the charge-carrier mobility:

$$E(z) = -\frac{e_0}{\epsilon_r \epsilon_0} \int_{d_{Epi}}^{z} N(z') dz' \qquad (Eq\ 1)$$

$$V(z) = -\int_{d_{Epi}}^{z} E(z') dz' = \frac{e_0}{\epsilon_r \epsilon_0} \int_{d_{Epi}}^{z} \int_{d_{Epi}}^{z'} N(z'') dz'' dz' \qquad (Eq\ 2)$$

$$\rho^{(2)} = \int_0^{d_{Epi}} \rho^{(3)}(z) dz = \int_0^{d_{Epi}} \frac{dz}{e\mu N(z)} \qquad (Eq\ 3)$$

The production method described below is based on the discovery that a punch-through design of the drift layer can be taken as a starting point. It may therefore be assumed that the drift layer is fully depleted of charge carriers in the off state. It may furthermore be assumed that the electric field $E(z)$ on the lower interface at $z=d_{Epi}$ has decreased to 0. The development of the production method also relies on the discovery that incomplete ionization of the doping atoms in the wide-bandgap material and the dependency of the mobility on the doping concentration are negligible.

The maximum electric field, which will be referred to below as the maximum field $E_{max}$, and the breakdown voltage $V_{Br}$ are given by Equations (Eq 1) and (Eq 2) for $z=0$ as:

$$E_{max} = E(z=0) = -\frac{e_0}{\epsilon_r \epsilon_0} \int_{d_{Epi}}^{0} N(z') dz' \qquad (Eq\ 4)$$

$$V_{Br} = V(z=0) = \frac{e_0}{\epsilon_r \epsilon_0} \int_{d_{Epi}}^{0} \int_{d_{Epi}}^{z'} N(z'') dz'' dz' \qquad (Eq\ 5)$$

By means of the production method described below, a doping profile $N(z)$ is obtained in the drift layer, with which the breakdown voltage $V_{Br}$ is maximized and at the same time the layer resistance $\rho$ is minimized. The production method is based on the discovery that the advantageous doping profile $N(z)$ can be derived by applying a Lagrange multiplier. The functional is given as:

$$L = \int_0^{d_{Epi}} dz (\rho^{(3)}(z) - \alpha V_{Br}) \qquad (Eq\ 6)$$

$$= \int_0^{d_{Epi}} \underbrace{\left( \frac{1}{e\mu N(z)} - \alpha \int_0^{d_{Epi}} E(z') dz' \right)}_{=l\left(E, \frac{dE}{dz}\right)},$$

where $\alpha$ is the so-called Lagrange multiplier.

The bracketed term $$l\left(E, \frac{dE}{dz}\right)$$

in Equation (Eq 6) preferably satisfies the Euler-Lagrange differential equation (Eq 7) with:

$$\frac{\partial l}{\partial E} - \frac{d}{dz} \frac{\partial l}{\partial E'} = 0. \qquad (Eq\ 7)$$

In order to solve equation (Eq 7), Equation (Eq 8) is used with:

$$N(z) = \frac{\epsilon_r \epsilon_0}{e_0} E'(z). \qquad (Eq\ 8)$$

This gives the differential equation (Eq 9):

$$N'(z) = -\alpha \frac{e_0^2 d_{Epi}}{2\epsilon_r \epsilon_0} N^3, \qquad (Eq\ 9)$$

which can be integrated by separation of the variables.

This gives Equation (Eq 10):

$$N(z) = \frac{N_0}{\sqrt{1 + \lambda\left(1 - \frac{z}{d_{Epi}}\right)}}. \quad \text{(Eq 10)}$$

In Equation (Eq 10) there is a gradient parameter $\lambda$ which is defined by means of Equation (Eq 11):

$$\lambda \equiv -\frac{\alpha e_0^2 d_{Epi}^2}{\varepsilon_r \varepsilon_0} N_0^2, \quad \text{(Eq 11)}$$

where $N_0$ denotes the maximum surface doping (doping of the lower interface) at $z=d_{Epi}$.

For the definition of the gradient parameter $\lambda$, a continuously decreasing concentration of the charge-carrier doping $N(z)$ along the growth direction of the drift layer is assumed, which can be achieved in the drift layer by means of the production method explained here. The gradient parameter $\lambda$ determines how much the doping profile varies. The greater the gradient parameter $\lambda$ is, the greater is the change in the doping concentration along the growth direction. In the limiting case $\lambda \to 0$, a constantly doped starting epitaxial layer is reproduced.

The functional relationship of the doping profile $N(z)$, as indicated in Equation (Eq 10), can be substituted into Equations (Eq 3) to (Eq 5). This gives Equations (Eq 12) to (Eq 14), with:

$$\rho^{(2)} = \frac{d_{Epi}}{e_0 \mu N_0} \cdot \underbrace{\frac{2}{3} \frac{(1+\lambda)^{3/2} - 1}{\lambda}}_{\equiv g(\lambda)} \quad \text{(Eq 12)}$$

$$E_{max} = \frac{e_0 N_0 d_{Epi}}{\varepsilon_r \varepsilon_0} \cdot \underbrace{2 \frac{\sqrt{1+\lambda} - 1}{\lambda}}_{\equiv f(\lambda)} \quad \text{(Eq 13)}$$

$$V_{Br} = \frac{e_0 N_0 d_{Epi}^2}{2\varepsilon_r \varepsilon_0} \cdot 4 \cdot \underbrace{\left\{\frac{2}{3\lambda^2}[(1+\lambda)^{3/2} - 1] - \frac{1}{\lambda}\right\}}_{\equiv h(\lambda)}. \quad \text{(Eq 14)}$$

Equations (Eq 12) to (Eq 14) describe the functional relationships of the drift layer (gradient epitaxial layer) produced. In addition to the specified values $E_{max}$ and $V_{Br}$, however, the parameters of the layer thickness $d_{Epi}$, the maximum surface doping $N_0$ and the gradient parameter $\lambda$ also occur in Equations (Eq 12) to (Eq 14).

For a predetermined/preferred maximum field $E_{max}$ and a given layer thickness $d_{Epi}$, the maximum surface doping $N_0$ can be derived from Equation (Eq 13):

$$N_0 \equiv N_0(E_{max}, d_{Epi}, \lambda) = \frac{\varepsilon_r \varepsilon_0 E_{max}}{e_0 d_{Epi} f(\lambda)}. \quad \text{(Eq 15)}$$

For the breakdown voltage $V_{Br}$, the following Equation (Eq 16) is obtained from Equation (Eq 14):

$$V_{Br} = V_{Br}(N_0(E_{max}, d_{Epi}, \lambda), d_{Epi}, \lambda) \quad \text{(Eq 16)}$$

-continued $$= \frac{e_0 N_0 d_{Epi}^2}{2 \cdot \varepsilon_r \varepsilon_0} \cdot h(\lambda)$$

$$= \frac{E_{max} d_{Epi}}{2} \cdot \frac{h(\lambda)}{f(\lambda)}.$$

For the layer thickness $d_{Epi}$ of the drift layer in Equation (Eq 17), this gives:

$$d_{Epi} = \frac{2V_{Br}}{E_{max}} \cdot \frac{f(\lambda)}{h(\lambda)}. \quad \text{(Eq 17)}$$

The layer thickness $d_{Epi}$ according to Equation (Eq 17) can then be substituted into Equation (Eq 15). This gives:

$$N_0 = \frac{\varepsilon_r \varepsilon_0 E_{max}^2}{2 e_0 V_{Br}} \cdot \frac{h(\lambda)}{f^2(\lambda)}. \quad \text{(Eq 18)}$$

For a predetermined/preferred maximum field $E_{max}$ and a predetermined/preferred breakdown voltage $V_{Br}$, the parameters of the drift layer can therefore be derived as a function of the gradient parameter $\lambda$. For the layer resistance $\rho$, this gives:

$$\rho^{(2)} = \frac{4 e_0 V_{Br}^2}{\mu \varepsilon_r \varepsilon_0 E_{max}^3} \cdot \frac{f^3(\lambda) g(\lambda)}{h^2(\lambda)}. \quad \text{(Eq 19)}$$

In the case of a gradient parameter $\lambda$ tending to infinity, the numerator of Equation (Eq 10) tends to infinity. So that the doping profile $N(z)$ remains finite, infinitely high maximum surface doping $N_0$ (in the lower interface) would therefore be advantageous.

For the gradient parameter $\lambda$ tending to infinity, the following approximations (Eq 20) to (Eq 22) can be derived for the functions $f(\lambda)$, $g(\lambda)$ and $h(\lambda)$:

$$f(\lambda) \approx \frac{2}{\sqrt{\lambda}} \quad \text{(Eq 20)}$$

$$g(\lambda) \approx \frac{2\sqrt{\lambda}}{3} \quad \text{(Eq 21)}$$

$$h(\lambda) \approx \frac{8}{3\sqrt{\lambda}}. \quad \text{(Eq 22)}$$

Approximations (Eq 20) to (Eq 22) give the following limiting values for the layer thickness $d_{Epi}$, the maximum surface doping $N_0$ and the layer resistance $\rho$ for a gradient parameter $\lambda$ tending to infinity:

$$\lim_{\lambda \to \infty} d_{Epi} = \frac{3V_{Br}}{2E_{max}} = \frac{3}{4} \cdot d_{Epi,const} \quad \text{(Eq 23)}$$

$$\lim_{\lambda \to \infty} N_0 = \frac{\varepsilon_r \varepsilon_0 E_{max}^2}{2 e_0 V_{Br}} \cdot \frac{2\sqrt{\lambda}}{3} = N_{0,const} \cdot \frac{2\sqrt{\lambda}}{3} \quad \text{(Eq 24)}$$

$$\lim_{\lambda \to \infty} \rho^{(2)} = \frac{3 e_0 V_{Br}^2}{\mu \varepsilon_r \varepsilon_0 E_{max}^3} = \frac{3}{4} \cdot \rho_{const}^{(2)}, \quad \text{(Eq 25)}$$

where the reference layer thickness $d_{epi.const}$, the reference surface doping $N_{0.const}$ and the reference layer resistance $\rho_{const}$ respectively pertain to the parameters of a corresponding reference drift layer (in punch-through design with $E(z=d_{Epi})=0$) with charge-carrier doping which is constant along the growth direction, the same maximum field $E_{max}$ and the same breakdown voltage $V_{Br}$.

By substituting Equation (Eq 24) into Equation (Eq 10) and taking limiting values, this gives:

$$\lim_{\lambda \to \infty} N(z) = \lim_{\lambda \to \infty} \frac{2N_{0.const}\sqrt{\lambda}}{3\sqrt{1+\lambda\left(1-\frac{z}{d_{Epi}}\right)}} \qquad \text{(Eq 26)}$$

$$= \frac{2}{3} \frac{N_{0.const}}{\sqrt{1-\frac{z}{d_{Epi}}}}.$$

Here, the doping concentration $N(z)$ on the upper interface is 2/3 of the concentration of the constantly doped reference drift layer. On the lower interface of the drift layer (gradient epitaxial layer), however, the doping concentration $N(z)$ diverges to infinity. This limiting case with a gradient parameter $\lambda$ tending to infinity is therefore not achievable.

The method described below, however, permits a drift layer which almost fully ensures the advantages of the limiting case described in the paragraphs above (with the gradient parameter $\lambda$ tending to infinity) by using a finite and readily achievable gradient parameter $\lambda$.

Between the first limiting case with a gradient parameter $\lambda$ tending to 0 and the second limiting case with a gradient parameter $\lambda$ tending to infinity, Equations (Eq 17) to (Eq 19) present a continuously differentiable transition.

The production method described here is based on the discovery that, for a particular range of values of the gradient parameter $\lambda$, the advantages of the second limiting case with $\lambda$ tending to infinity can be achieved to a high percentage and at the same time the doping profile can be varied continuously in a straightforward way during the epitaxial deposition process. In order to achieve this, the gas flows and/or gas ratios in the epitaxy apparatus are merely varied continuously with a suitable value of the gradient parameter $\lambda$.

In order to represent the advantages of this method, reference will be made to the figures described below:

FIGS. 1A to 1D show four coordinate systems to explain a relation between a gradient parameter, a layer thickness, a layer resistance, maximum surface doping, a maximum field and a breakdown voltage of a drift layer formed by means of a first embodiment of the production method.

FIG. 1A indicates a relationship between the gradient parameter $\lambda$ and a layer thickness $d_{Epi}$, which can be used instead of reference surface doping $M_{o.const}$ of $6\times10^{15}$ cm$^{-3}$ and a reference layer thickness $d_{epi.const}$ of 14 μm to ensure a predetermined/preferred maximum field $E_{max}$ and a predetermined/preferred breakdown voltage $V_{Br}$. Here, the abscissa is the gradient parameter $\lambda$ and the ordinate is the associated layer thickness $d_{Epi}$ in micrometers.

Between the value range of from $10^{-1}$ to $10^2$, a transition region having a negative slope with a large magnitude can be seen. A gradient parameter $\lambda$ in this value range of between $10^{-1}$ and $10^3$ therefore already ensures an advantageous thin drift layer compared with the reference layer thickness $d_{epi.const}$ of 14 μm for the constantly doped reference drift layer. Owing to the thinner configuration of the drift layer formed by means of the production method described here, for example, the production costs can be reduced.

Figure 1B:
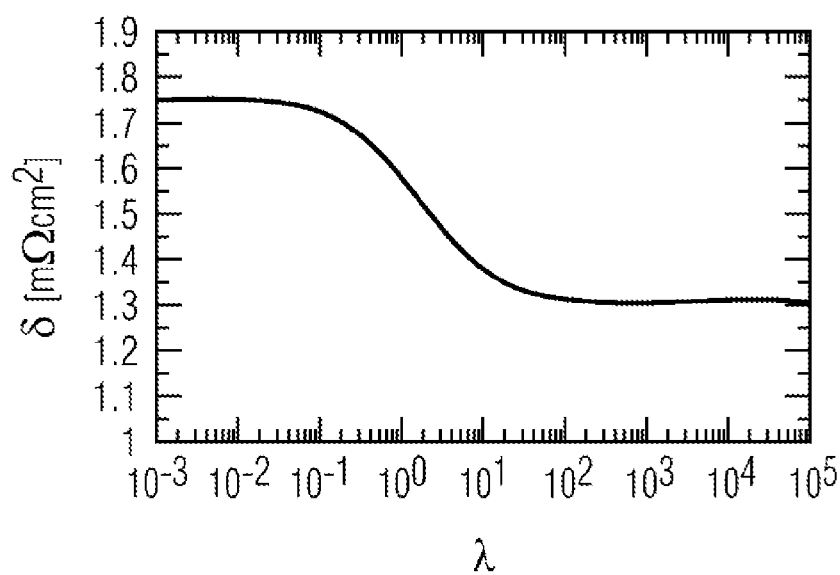

FIG. 1B illustrates a relationship between the gradient parameter $\lambda$ and an associated layer resistance $\rho$. The abscissa is the gradient parameter $\lambda$. The ordinate is the associated layer resistance $\rho$ in mΩcm$^2$. The numerical values reproduced refer to the aforementioned values of the reference surface doping $N_{0.const}$ of $6\times10^{15}$ cm$^{-3}$, and the reference layer thickness $d_{epi.const}$ of 14 μm.

A transition region of the layer resistance ρ can also be seen in FIG. 1B for a gradient parameter Α in the value range of between $10^{-1}$ and $10^3$. In this transition region, the layer resistance ρ has off with a strong gradient profile. A gradient parameter $\lambda$ of more than $10^{-1}$ is therefore advantageous for a drift layer with a low layer resistance ρ.

Above a gradient parameter $\lambda$ of 100, the layer resistance ρ scarcely decreases any further. This can also be interpreted as meaning that the layer resistance ρ has almost already reached its optimal value with a gradient parameter $\lambda$ of 100. It is therefore sufficient to form a drift layer with a gradient parameter $\lambda$ in the value range of between $10^{-1}$ and $10^3$. A further increase in the gradient parameter $\lambda$ beyond $10^3$ is not associated with any significant advantages compared with a gradient parameter $\lambda$ in the value range of between $10^{-1}$ and $10^3$.

In the production method described here, a gradient parameter $\lambda$ in the value range of between $10^{-1}$ and $10^3$, preferably between 50 and 200, in particular 100, is therefore preferably used. For such a gradient parameter $\lambda$, owing to the square root dependency, there is a doping bandwidth of about one order of magnitude between maximum doping on the lower interface and minimum doping on the upper interface. This doping bandwidth can be achieved straightforwardly by epitaxial deposition of the material of the drift layer.

Figure 1C:
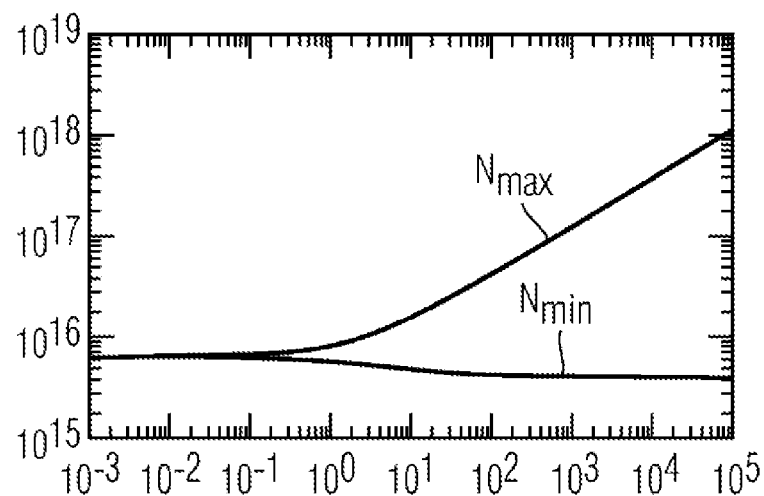

FIG. 1C indicates the maximum surface doping $N_{max}$ on the lower interface and the minimum surface doping $N_{min}$ on the upper interface as a function of the gradient parameter $\lambda$. The numerical values indicated on the ordinate refer to the reference surface doping $N_{0.const}$ of $6\times10^{15}$ cm$^{-3}$ and the reference layer thickness $d_{epi.const}$ of 14 μm.

Figure 1D:
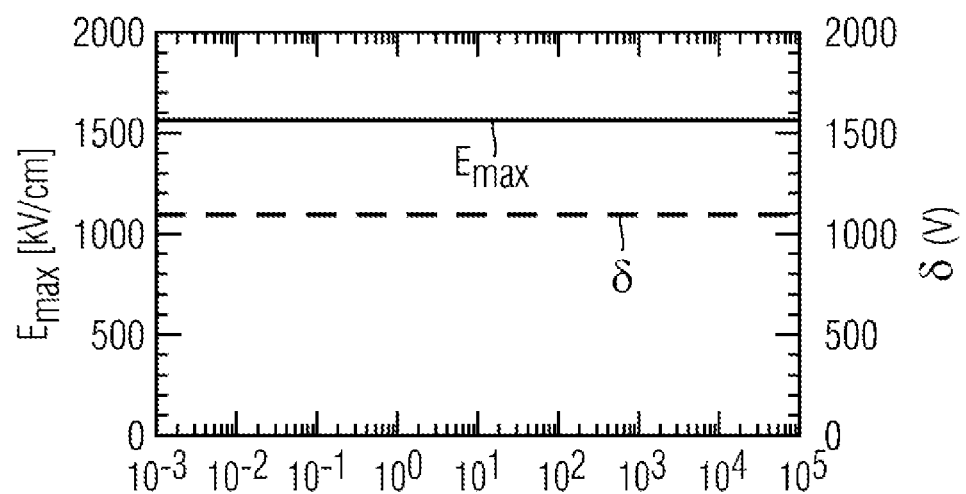

FIG. 1D indicates a relationship between the gradient parameter $\lambda$, the maximum field $E_{max}$ and the breakdown voltage $V_{Br}$. The respective numerical values for the maximum field $E_{max}$ and the breakdown voltage $V_{Br}$ of the ordinates refer to the reference surface doping $N_{0.const}$ of $6\times10^{15}$ cm$^{-3}$ and the reference layer thickness $d_{epi.const}$ of 14 μm.

As can be seen in FIG. 1D, for all numerical values of the gradient parameter $\lambda$ studied here, a predetermined/preferred maximum field $E_{max}$ and a predetermined/preferred breakdown voltage $V_{Br}$ are kept constant. The predetermined/preferred maximum field $E_{max}$ is about 1500 kV/cm. The predetermined/preferred breakdown voltage $V_{Br}$ is about 1100 V.

In the production method described here, the drift layer is preferably formed with a layer thickness $d_{Epi}$ which is established while taking into account the predetermined/preferred breakdown voltage $V_{Br}$ and the predetermined/preferred maximum field $E_{max}$ of the drift layer. In particular, the following may apply:

$$d_{Epi} = \frac{3V_{Br}}{2E_{max}}. \qquad \text{(Eq 27)}$$

As an alternative, (Eq 17) may also be applied in order to ensure the advantages.

An advantageous relationship of this type between the layer thickness $d_{Epi}$, the maximum field $E_{max}$ and the breakdown voltage $V_{Br}$ can be achieved straightforwardly if the gradient parameter $\lambda$ lies in a value range of between 10 and 1000. In the production method described here, the layer thickness $d_{Epi}$ can thereby be reduced by up to 25% compared with the reference layer thickness $d_{epi.const}$ of the constantly doped reference drift layer. Accordingly, the layer resistance $\rho$ can be reduced to as little as 75% of the reference layer resistance of the constantly doped reference drift layer. This ensures the abovementioned advantages.

Additionally, in the production method, the lower interface of the drift layer may be formed with maximum surface doping $N_0$ which is established while taking into account the preferred breakdown voltage $V_{Br}$, the preferred maximum field $E_{max}$ of the drift layer and a gradient parameter $\lambda$ in a range of between 10 and 1000. Equation (Eq 18) may in particular apply, or Equation (Eq 28) with:

$$N_0 = \frac{\varepsilon_r \varepsilon_0 E_{max}}{2e_0 V_{Br}} \cdot \frac{2\sqrt{\lambda}}{3}. \qquad \text{(Eq 28)}$$

Furthermore, the drift layer may be formed with doping $N(z)$ along the growth direction which is established while taking into account the layer thickness $d_{Epi}$ of the maximum surface doping $N_0$ of the lower interface of the drift layer and the gradient parameter $\lambda$ in the range of between 10 and 1000. Preferably, Equation (Eq 29) applies with:

$$N(z) = \frac{N_0}{\sqrt{1 + \lambda\left(1 - \frac{z}{d_{Epi}}\right)}}. \qquad \text{(Eq 29)}$$

Such a doping profile $N(z)$ can be achieved straightforwardly and reliably when forming the drift layer by epitaxial deposition of a material which comprises at least one wide-bandgap material and the charge-carrier doping. In particular, the drift layer may be formed from the wide-bandgap material and the charge-carrier doping. Preferably, the gradient parameter $\lambda$ lies in a range of between 50 and 200. In an advantageous embodiment, silicon carbide and/or gallium nitride is deposited as the wide-bandgap material. In this way, the advantages already described above are obtained.

For example, the formation of the drift layer may be based on reference surface doping $N_{0.const}$ of $6 \times 10^{15}$ cm$^{-3}$, a reference layer thickness $d_{Epi.const}$ of 14 µm and a reference layer resistance $\rho_{const}$ of about 1.75 mΩcm$^2$. The drift layer may be formed with a gradient parameter $\lambda$ of 100, the maximum surface doping $N_0$ being $4.2 \times 10^{16}$ cm$^{-3}$, the minimum surface doping of the upper interface being $4.2 \times 10^{15}$ cm$^{-3}$, the layer thickness $d_{Epi}$ being 11 µm and the layer resistance $\rho$ being about 1.33 mΩcm$^2$.

Such a drift layer is advantageous for many embodiments of a semiconductor component.

A drift layer (gradient epitaxial layer) produced by means of the production method described here has an on-resistance which is less than the on-resistance of a constantly doped epitaxial layer. This is advantageous even though the electrical properties of a semiconductor component, in particular a switching component, are not defined exclusively by the drift layer.

Owing to the heavier doping on the lower interface, the electric field increases more strongly in this region. Inside the drift layer, the electric field is in this case somewhat higher than in a corresponding reference drift layer with constant doping. However, the electric field in a drift layer with a $\lambda \neq 0$ increases more slowly, so that the maximum field $E_{max}$ (maximum field strength) is not exceeded on the surface. Illustratively speaking, the potential which is absorbed in the constant reference drift layer directly on the lower interface is displaced into the volume of the drift layer in the drift layer with a $\lambda$ of between 10 and 1000.

As studies have shown, a semiconductor component having the drift layer obtained by means of the technique described here can advantageously be used.

FIG. 2 shows a flowchart to represent a second embodiment of the method for producing a unipolar semiconductor component.

In an optional method step S1 of the production method, a process chamber used for epitaxial deposition of a material of a drift layer is evacuated and/or flushed. In a method step S2 carried out simultaneously, before or afterward, the process chamber is heated to a growth temperature of the drift layer. Because the drift layer produced in the process chamber by means of the epitaxial deposition comprises a wide-bandgap material, the process chamber is preferably preheated to a relatively high growth temperature. If silicon carbide is to be deposited as the wide-bandgap material, the process chamber may be heated to a growth temperature of at least 1400° C.

Before beginning the epitaxial deposition of the material of the drift layer, a pressure in the process chamber and/or the gas flows of the carrier gases may be adjusted in an optional method step S3. Likewise, in a further optional method step S4, a surface on which the drift layer is formed by means of the epitaxial deposition may be etched. The references pertaining to method steps S1 to S4 do not, however, dictate a time sequence for carrying out the method steps.

In order to start the epitaxial deposition of the drift layer, the reactive gases used for the epitaxial deposition are switched on in a method step S5. If the drift layer is formed from a material which comprises silicon carbide and charge-carrier doping, then $SiH_4$, $C_3H_8$ and a doping gas are preferably used as reactive gases. The doping gases known from the prior art may be used as a doping gas for charge-carrier doping. If the drift layer is also intended to comprise a further material in addition to the silicon carbide and the charge-carrier doping, then a doping gas usable for the material is likewise switched on.

After the method step S5, in a method step S6, the epitaxial deposition of the drift layer is carried out during a growth phase. By changing, as a function of time, a gas flow of at least one of the reactive gases used, a drift layer which has a continuously decreasing concentration of the charge-carrier doping along the growth direction of the drift layer is deposited during the growth phase.

For example, the relationship represented in the coordinate system between a time t and a doping gas flow A is adopted. Here, the abscissa of the coordinate system corresponds to the time t. The ordinate illustrates the continuously (strictly monotonically) decreasing doping gas flow A. In particular, the doping gas flow may decrease exponentially.

The duration of the growth phase, or the method step S6, may be selected so that the drift layer is formed with a layer thickness according to Equation (Eq 17) or (Eq 27). The layer thickness of the drift layer according to Equation (Eq 17) or (Eq 27) is thus only about 75% of a reference layer thickness of a constantly doped reference drift layer. By forming the drift layer with a reduced layer thickness according to Equation (Eq 17) or (Eq 27), the production of the drift layer becomes more favorable. This is advantageous in particular when using silicon carbide. In conjunction with the continuously decreasing doping concentration along the growth direction, the reduced layer thickness has the additional effect that variations in the doping and/or the layer thickness have less impact on the breakdown voltage of the drift layer produced.

At the beginning of the method step S6, a lower interface of the drift layer, which faces a substrate, may be formed with maximum surface doping according to Equation (Eq 18) or (Eq 28). Furthermore, a concentration of the charge-carrier doping along the growth direction according to Equation (Eq 29) may be formed by means of a suitable relationship between the time t and the doping gas flow A. Preferably, the gradient parameter lies in a range of between 10 and 1000 in this case. The gradient parameter may, in particular, lie in a range of between 50 and 200.

A drift layer with a concentration of the charge-carrier doping according to Equation (Eq 29) has the advantages of a comparatively high breakdown voltage together with simultaneously relatively low conduction losses. The drift layer formed by means of the production method described here is therefore particularly suitable for a semiconductor component.

Because the advantageous concentration of the charge-carrier doping according to Equation (Eq 29) is set by means of epitaxial deposition of a wide-bandgap material, for example silicon carbide and/or gallium nitride, at a comparatively high temperature, later modification of the concentration profile due to diffusion of the dopants is prevented. This is a substantial advantage of the drift layer comprising the wide-bandgap material over a conventional drift layer consisting of silicon. In a conventional drift layer consisting of silicon, the concentration profile of the charge-carrier doping is generally modified after production of the silicon drift layer because of diffusion of the charge-carrier doping due to subsequent processes. In the case of a silicon drift layer, it is therefore scarcely possible to use a preferred concentration profile of the charge-carrier doping over a prolonged period of time. This problem can be resolved by means of the production method described here.

The production method described here is not restricted to establishing the continuously decreasing concentration of the charge-carrier doping along the growth direction of the drift layer by varying a gas flow A of the at least one doping gas flow A for the charge-carrier doping during the epitaxial deposition of the material of the drift layer. As an alternative or in addition to varying the doping gas flow A, the production method may also involve a method step in which the continuously decreasing concentration of the charge-carrier doping along the growth direction of the drift layer is formed by means of additional or else exclusive variation of a ratio of a first component material of the wide-bandgap material and a second component material of the wide-bandgap material. For example, the continuously decreasing concentration of the charge-carrier doping may be formed by varying a ratio of carbon and silicon during the epitaxial deposition of the material of the drift layer.

The epitaxial deposition of the drift layer, or the growth phase, is ended by switching off the reactive gases in a method step S7. In an optional method step S8, a process of cooling the process chamber may be carried out. Subsequently, the process chamber may be flushed with an inert gas in a further optional method step S9. A normal pressure may likewise be set up in the process chamber in method step S9.

FIG. 3 shows a schematic representation of a first embodiment of the semiconductor device.

The semiconductor device 10 schematically represented in FIG. 3 comprises a substrate 12 and a semiconductor component formed as a type-1 VJFET. The substrate 12 comprises comparatively heavy n-type doping. A drain contact 14 is formed on a lower side of the substrate 12. A drift layer 16 of the VJFET is formed on an upper side of the substrate 12, opposite the lower side.

The drift layer 16 has a continuously decreasing concentration of n-type charge-carrier doping along a direction 19 from a first interface 18, which faces the substrate 12, to a second interface 20 on the other side from the first interface 18. The average concentration of the n-type charge-carrier doping of the drift layer 16 is preferably less than the average concentration of the n-type doping of the substrate 12.

The drift layer 16 comprises at least one wide-bandgap material and the n-type charge-carrier doping. Preferably, the drift layer 16 is formed from the wide-bandgap material and the n-type charge-carrier doping. A preferred wide-bandgap material is silicon carbide and/or gallium nitride. By using silicon carbide in the drift layer 16, preferred charge-carrier doping can be carried out straightforwardly and maintained reliably during operation of the semiconductor device 10.

In a preferred embodiment, an average layer thickness of the drift layer 16 corresponds to Equation (Eq 17). It is also advantageous for the average layer thickness of the drift layer 16 to correspond to Equation (Eq 27). The drift layer 16 can thus be produced with a comparatively low average layer thickness. This reduces the costs for production of the drift layer 16.

The maximum surface doping on the first interface 18 of the drift layer 16 may be according to Equation (Eq 18). In another advantageous embodiment, the maximum surface doping may correspond to Equation (Eq 28). Accordingly, the drift layer 16 may have a concentration according to Equation (Eq 29) as the continuously decreasing concentration of the charge-carrier doping. The gradient parameter $\lambda$, which occurs in Equations (Eq 17), (Eq 18), (Eq 28) and (Eq 29), may lie in a range of between 10 and 1000. Preferably, the gradient parameter lies in a range of between 50 and 200.

The drift layer 16 may be formed by means of a production method according to the embodiments described above. In this context, method steps of the individual embodiments may also be combined to form a further embodiment of the production method.

On a side of the drift layer 16 opposite the substrate 12, p-doped and n-doped regions 22 and 24 are formed. The p-doped regions 22 may respectively be contacted by means of an associated gate contact 26. Correspondingly, the n-doped regions 24 may respectively be contacted by means of a source contact 28. Because methods for producing the components 22 to 28 and the functionality of the semiconductor device 10 are known from the prior art, they will not be discussed in detail here. It will, however, be pointed out that the production method for forming the drift layer can straightforwardly be integrated into the overall method for producing the semiconductor device 10 consisting of the components 12 to 16 and 22 to 28.

FIG. 4 shows a schematic representation of a second embodiment of the semiconductor device.

The semiconductor device 30 represented comprises a semiconductor component formed as a type-2 VJFET. The substrate 12 of the semiconductor device 30 preferably comprises 4H-SiC. The drift layer 16 may also comprise this material (4H-SiC). In particular, the drift layer 16 comprises the wide-bandgap material, for example silicon carbide and/or gallium nitride, and the n-type charge-carrier doping. The drift layer has a continuously decreasing concentration of the n-type charge-carrier doping along the direction 19 from the first interface 18 which faces the substrate region to the second interface 20 on the opposite side from the first interface 18. In a preferred embodiment, the drift layer 16 has the properties according to Equations (Eq 17), (Eq 18) and (Eq 29). Advantageously, the drift layer 16 may also correspond to Equations (Eq 27), (Eq 28) and (Eq 29). The gradient parameter λ, which occurs in Equations (Eq 17), (Eq 18), (Eq 28) and (Eq 29), may lie in a range of between 10 and 1000.

The semiconductor device 30 can therefore be produced more economically in comparison with a conventional type-2 VJFET. The more advantageous layer resistance may in this case also contribute to the cost advantage. The active area can be selected to be smaller owing to this advantageous layer resistance, which reduces the costs per component.

The semiconductor device 30 can likewise straightforwardly be produced so that a predetermined/preferred maximum (electric) field of the drift layer 16 and a predetermined/preferred breakdown voltage of the drift layer 16 are ensured.

The further components 12 and 22-24 of the semiconductor device 30 correspond to the embodiment of FIG. 3 which has already been described. Repeated description is therefore omitted here.

As an alternative to the semiconductor devices 10 and 30 having an n-doped drift layer 16, corresponding embodiments having a p-doped drift layer may also be produced.

FIGS. 5A and 5B show schematic representations of a third embodiment of the semiconductor device.

Each of both FIGS. 5A and 5B respectively shows a half-cell of a MOSFET. FIG. 5A shows a half-cell 40 formed as a DMOS. FIG. 5B shows a half-cell 42 formed as a UMOS. Each of the two half-cells 40 and 42 has a drift layer 16 which is formed at least from a wide-bandgap material and n-type charge-carrier doping. Preferably, the wide-bandgap material is silicon carbide and/or gallium nitride. Each of the two drift layers 16 has a continuously decreasing concentration of the n-type charge-carrier doping along a direction 19 from the first interface 18, which faces the substrate 12, to the second interface 20. The parameters of each drift layer 16 may be established according to Equations (Eq 17), (Eq 18) and (Eq 29). In an advantageous embodiment, the parameters of each drift layer 16 may also correspond to Equations (Eq 27), (Eq 28) and (Eq 29). The gradient parameter λ, which occurs in Equations (Eq 17), (Eq 18), (Eq 28) and (Eq 29), may lie in a range of between 10 and 1000.

In order to produce the half-cells 40 and/or 42, one of the embodiments of the production method as described above or a combination thereof may be used. The method steps for producing the respective drift layer 16 may be applied straightforwardly in the overall production method, in which the contacts 14, 26 and 28, the p-doped layers 44 and 46, the n-doped layers 48 and the insulating layers 50 are formed in addition to the drift layers 16. A possible overall production method for producing at least one of the two half-cells 40 or 42 will therefore not be discussed in further detail here. Half-cells having a p-doped drift layer may furthermore be formed by means of a corresponding overall production method.

Figure 6:
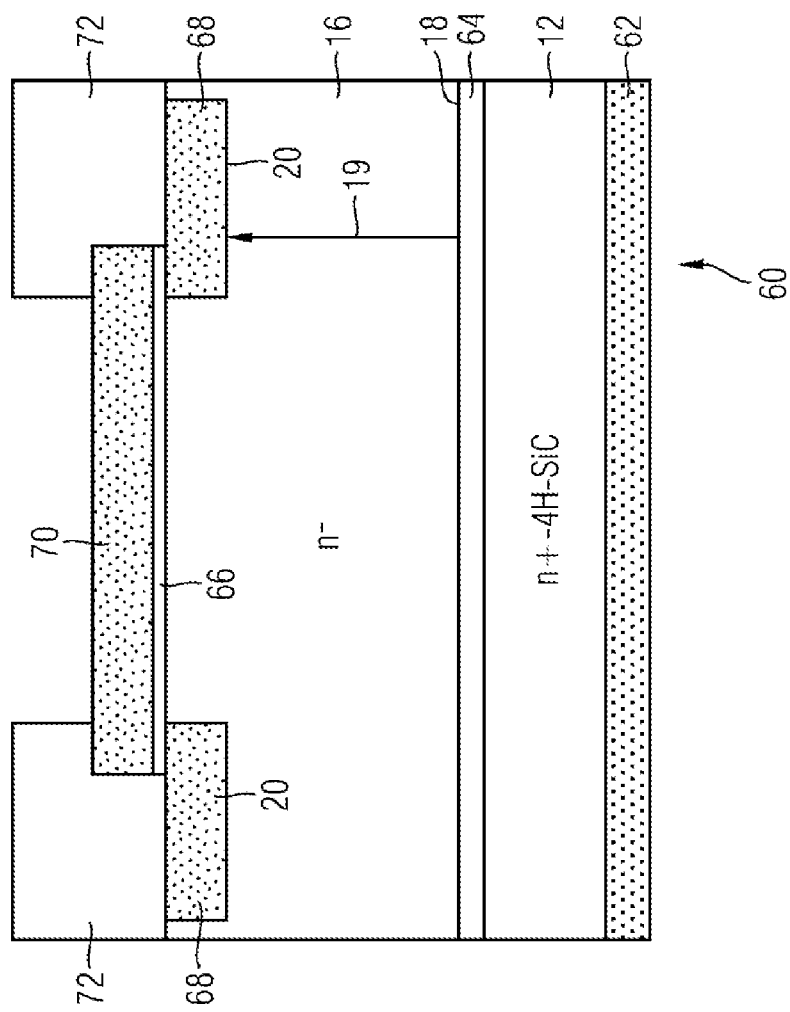
FIG. 6 shows a schematic representation of a fourth embodiment of the semiconductor device.

FIG. 6 shows a schematic representation of a fourth embodiment of the semiconductor device.

The semiconductor device 60 represented is formed as a Schottky diode. A solderable backside contact 62 is arranged on a lower side of the substrate 12. The upper side of the substrate 12 is covered at least partially by a field-stop layer 64. An n-doped drift layer 16 consisting of a wide-bandgap material, for example silicon carbide and/or gallium nitride, and n-type charge-carrier doping, is formed on the field-stop layer 64. The drift layer 16 may also comprise at least one further material in addition to the wide-bandgap material and the n-type charge-carrier doping.

The drift layer 16 has the continuously decreasing concentration of the charge-carrier doping along the direction 19 from the first interface 18 to the second interface 20. The parameters of the drift layer 16 preferably satisfy at least one of Equations (Eq 17), (Eq 18) and (Eq 29). In another advantageous embodiment, the parameters of each drift layer 16 may also correspond to Equations (Eq 27), (Eq 28) and (Eq 29). The gradient parameter may lie between 10 and 1000. The gradient parameter preferably lies in a range of between 50 and 200.

A Schottky contact 66 and JTE regions 68 are formed on an opposite side of the drift layer 16 from the field-stop layer 64. The Schottky contact 66, which is covered by an aluminum layer 70, connects the two JTE regions 68 to one another. Those surfaces of the JTE regions 68 which are not covered by the components 66 and 70 are covered by passivations 72. The Schottky contact 66 is therefore formed as a bondable frontside contact.

A method for producing the drift layer 16 can be integrated straightforwardly into the method for producing the semiconductor device 60 represented in FIG. 6. The advantages already described above are in this case obtained for the Schottky diode. Functionality of the Schottky diode will therefore not be discussed in detail here. A Schottky diode having an advantageous p-doped drift layer may likewise be produced by means of a correspondingly modified production method.

LIST OF REFERENCES

A doping gas flow
$d_{Epi}$ layer thickness
$E_{max}$ maximum field
λ gradient parameter
$N_{max}$ maximum surface doping
$N_{min}$ minimum surface doping
ρ layer resistance
S1 to S9 method step
t time
$V_{Br}$ breakdown voltage
10 semiconductor device
12 substrate
14 drain contact
16 drift layer
18 and 20 interfaces
19 direction
22 p-doped regions
24 n-doped regions
26 gate contact
28 source contact
30 semiconductor device
40 and 42 half-cells
44 and 46 p-doped layers
48 n-doped layers
50 insulating layers
60 semiconductor device
62 backside contact
64 field-stop layer
66 Schottky contact
68 JTE regions
70 aluminum layer
72 passivations

The invention claimed is:

1. A method of producing a unipolar semiconductor component having a drift layer, the method comprising forming the drift layer with a continuously decreasing concentration of charge-carrier doping along a growth direction of the drift layer by epitaxial deposition of a material of the drift layer which comprises at least one wide-bandgap material, wherein the drift layer has a layer thickness ($d_{Epi}$) that is determined by a preferred breakdown voltage ($V_{Br}$) of the drift layer and a preferred maximum electric field ($E_{max}$) of the drift layer, where:

$$d_{Epi} = \frac{2V_{Br}}{E_{max}} \cdot \frac{f(\lambda)}{h(\lambda)};$$

$$f(\lambda) = 2\frac{\sqrt{1+\lambda} - 1}{\lambda};$$

$$h(\lambda) = 4 \cdot \left\{ \frac{2}{3\lambda^2}[(1+\lambda)^{3/2} - 1] - \frac{1}{\lambda} \right\};$$

and $\lambda$ is in a range of between 10 and 1000.

2. The method as claimed in claim 1, wherein the drift layer is formed from the wide-bandgap material and the charge-carrier doping.

3. The method as claimed in claim 1, wherein the wide-bandgap material has an energy gap which is greater than the energy gap of silicon.

4. The method as claimed in claim 1, wherein the drift layer is formed from at least one of silicon carbide and gallium nitride.

5. The method as claimed in claim 1, wherein an interface of the drift layer with a substrate region is formed with a maximum doping ($N_0$) which is established while taking into account the preferred breakdown voltage ($V_{Br}$) of the drift layer, the preferred maximum electric field ($E_{max}$) of the drift layer and the gradient parameter ($\lambda$), where:

$$N_0 = \frac{\varepsilon_r \varepsilon_0 E_{max}}{2e_0 V_{Br}} \cdot \frac{2\sqrt{\lambda}}{3}$$

and $\lambda$ is in a range of between 10 and 1000.

6. The method as claimed in claim 5, wherein $\lambda$ is in a range of between 50 and 200.

7. The method as claimed in claim 1, wherein the drift layer is formed with a concentration ($N(z)$) of the charge-carrier doping along the growth direction of the drift layer which is established while taking into account the layer thickness ($d_{Epi}$) of the drift layer, a maximum doping ($N_0$) of the interface of the drift layer and the gradient parameter ($\lambda$), where:

$$N(z) = \frac{N_0}{\sqrt{1 + \lambda\left(1 - \frac{z}{d_{Epi}}\right)}}$$

and $\lambda$ is in the range of between 10 and 1000.

8. The method as claimed in claim 7, wherein $\lambda$ is in a range of between 50 and 200.

9. The method as claimed in claim 1, wherein the continuously decreasing concentration of the charge-carrier doping along the growth direction of the drift layer is formed by varying a gas flow of at least one dopant for the charge-carrier doping during the epitaxial deposition of the material of the drift layer.

10. The method as claimed in claim 1, wherein the continuously decreasing concentration of the charge-carrier doping along the growth direction of the drift layer is formed by varying a ratio of a first gas flow and a second gas flow during the epitaxial deposition of the material of the drift layer, the first gas flow and the second gas flow comprising the wide-bandgap material.

11. A semiconductor device, comprising:
a substrate region; and
a unipolar semiconductor component with a drift layer which has a continuously decreasing concentration of charge-carrier doping along a direction from a first interface facing the substrate region to a second interface on an opposite side from the first interface, and which comprises at least one wide-bandgap material,
wherein the drift layer has a layer thickness ($d_{Epi}$) that is determined by a preferred breakdown voltage ($V_{Br}$) of the drift layer and a preferred maximum electric field ($E_{max}$) of the drift layer,
where:

$$d_{Epi} = \frac{2V_{Br}}{E_{max}} \cdot \frac{f(\lambda)}{h(\lambda)};$$

$$f(\lambda) = 2\frac{\sqrt{1+\lambda} - 1}{\lambda};$$

$$h(\lambda) = 4 \cdot \left\{ \frac{2}{3\lambda^2}[(1+\lambda)^{3/2} - 1] - \frac{1}{\lambda} \right\};$$

and $\lambda$ is in a range of between 10 and 1000.

12. The semiconductor device as claimed in claim 11, wherein the at least one wide-bandgap material has an energy gap greater than the energy gap of silicon.

13. The semiconductor device as claimed in claim 11, wherein the drift layer comprises at least one of silicon carbide and gallium nitride.

14. The semiconductor device as claimed in claim 11, wherein the first interface of the drift layer has a maximum doping ($N_0$) which is a function of the preferred breakdown voltage ($V_{Br}$) of the drift layer, the preferred maximum electric field ($E_{max}$) of the drift layer and the gradient parameter ($\lambda$) as given by:

$$N_0 = \frac{\varepsilon_r \varepsilon_0 E_{max}}{2e_0 V_{Br}} \cdot \frac{2\sqrt{\lambda}}{3},$$

where $\lambda$ is in a range of between 10 and 1000.

15. The semiconductor device as claimed in claim 14, wherein $\lambda$ is in a range of between 50 and 200.

16. The semiconductor device as claimed in claim 11, wherein the concentration ($N(z)$) of the charge-carrier doping along the direction from the first interface to the second interface is a function of the layer thickness ($d_{Epi}$) of the drift layer, a maximum doping ($N_0$) of the interface of the drift layer and the gradient parameter ($\lambda$) as given by:

$$N(z) = \frac{N_0}{\sqrt{1 + \lambda\left(1 - \frac{z}{d_{Epi}}\right)}},$$

where $\lambda$ is in the range of between 10 and 1000.

17. The semiconductor device as claimed in claim 16, wherein $\lambda$ is in a range of between 50 and 200.

18. A semiconductor device comprising a unipolar semiconductor component having a drift layer with a continuously decreasing concentration of charge-carrier doping along a direction from a first interface facing the substrate region to a second interface on an opposite side from the first interface, the drift layer comprising at least one wide-bandgap material.

* * * * *